(12) United States Patent
Yang et al.

(10) Patent No.: US 7,416,792 B2
(45) Date of Patent: Aug. 26, 2008

(54) FULL COLOR ORGANIC ELECTROLUMINESCENCE DISPLAY DEVICES BY THERMAL PATTERNING USING LASER AND METHOD FOR MANUFACTURING THE SAME

(75) Inventors: Nam-Choul Yang, Suwon-si (KR); Tae-Min Kang, Suwon-si (KR); Myung-Won Song, Suwon-si (KR); Seong-Taek Lee, Suwon-si (KR); Min-Chul Suh, Suwon-si (KR); Byung-Doo Chin, Suwon-si (KR); Mu-Hyun Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 517 days.

(21) Appl. No.: 10/954,280

(22) Filed: Oct. 1, 2004

(65) Prior Publication Data
US 2005/0116241 A1    Jun. 2, 2005

(30) Foreign Application Priority Data
Nov. 29, 2003   (KR) ...................... 10-2003-0086125

(51) Int. Cl.
*H01L 51/50*   (2006.01)
(52) U.S. Cl. ................... 428/690; 428/32.8; 428/32.81; 428/917; 313/504; 313/506
(58) Field of Classification Search ................. 428/690, 428/917, 32.8, 32.81; 313/504, 506; 427/372.2
See application file for complete search history.

(56) References Cited
U.S. PATENT DOCUMENTS
5,220,348 A    6/1993   D'Aurelio

| | | |
|---|---|---|
| 5,256,506 A | 10/1993 | Ellis et al. |
| 5,278,023 A | 1/1994 | Bills et al. |
| 5,308,737 A | 5/1994 | Bills et al. |
| 6,114,088 A * | 9/2000 | Wolk et al. ................ 430/273.1 |
| 2003/0064248 A1* | 4/2003 | Wolk et al. .................. 428/690 |
| 2005/0123801 A1* | 6/2005 | Yang et al. .................. 428/690 |

FOREIGN PATENT DOCUMENTS
KR    10-2002-0025840    4/2002

OTHER PUBLICATIONS
Korean Office Action of the Korean Patent Application No. 2003-86125, issued on Mar. 30, 2006.

* cited by examiner

*Primary Examiner*—Dawn Garrett
(74) *Attorney, Agent, or Firm*—Robert E. Bushnell, Esq.

(57) ABSTRACT

An organic electroluminescence display device made by a laser induced thermal imaging process has a substrate having first and second electrode layers, and an organic layer having red, green, and blue light-emitting layers between the electrode layers. Thermosetting light-emitting materials are used to form the red, green, and blue light-emitting layers, and a laser is then selectively irradiated onto a light-to-heat conversion layer formed on the substrate to deliver heat energy converted from light energy through the light-to-heat conversion layer to the thermosetting light-emitting materials so that curing is progressed to form patterned light-emitting layers. In accordance with the fabrication method of the present invention, the light-emitting materials may be patterned using a laser, thereby fabricating a large scaled organic electroluminescence display device and simplifying the process by not using a mask when the light-emitting layers are formed.

12 Claims, 4 Drawing Sheets

FULL COLOR ORGANIC ELECTROLUMINESCENCE DISPLAY DEVICES BY THERMAL PATTERNING USING LASER AND METHOD FOR MANUFACTURING THE SAME

CLAIM OR PRIORITY

This application makes reference to, incorporates the same herein, and claims all benefits accruing under 35 U.S.C. §119 from an application for FULL COLOR ORGANIC ELECTROLUMINESCENCE DISPLAY DEVICES BY THERMAL PATTERNING USING LASER AND METHOD FOR MANUFACTURING THE SAME earlier filed in the Korean Intellectual Property Office on 29 Nov. 2003 and there duly assigned Serial No. 2003-86125.

BACKGROUND OF THE INVENTION

1. Field of the Invention

The present invention generally relates to, an organic electroluminescence (EL) device, more particularly to a full color organic electroluminescence (EL) display device, which enables light-emitting layers to be patterned by introducing a thermosetting light-emitting material and a light-to-heat conversion layer capable of converting light energy of a laser to heat energy and a method for manufacturing the same.

2. Description of the Related Art

In general, an organic EL display device is composed of several layers such as an anode, a cathode, a hole injecting layer, a hole transporting layer, a light-emitting layer, an electron transporting layer, and an electron injecting layer. The organic EL display devices may be classified into polymeric and small molecular types based on materials to be used, and each layer may be formed by vacuum deposition in the case of small molecular organic EL devices and by spin coating in the case of polymeric organic EL devices to form light-emitting devices.

In the case of single color devices, the organic EL device using the polymer may be simply fabricated using the spin coating process, however, it has a disadvantage that efficiency and lifetime are degraded in spite of a low driving voltage compared to the small molecular type.

When a full color device is fabricated, each of the red, green, and blue color polymers should be patterned, which causes luminous properties including efficiency and lifetime to be degraded when an inkjet printing method or a laser induced thermal imaging (LITI) method is used. In order to apply the LITI method, a light source, a transfer film, and a substrate are at least required, and light emitted from the light source should be absorbed by a light-absorbing layer of the transfer film, and should be converted to heat energy. The transfer materials of the transfer film should be transferred onto the substrate by means of the converted heat energy to form a desired image. (See U.S. Pat. Nos. 5,220,348, 5,256, 506, 5,278,023, and 5,308.737 for its reference.)

The LITI method uses a donor film which is not a proper material when it is applied to a substrate with a complicated structure having stepped regions, and in particular, it is not preferable to use the donor film because external physical force is applied to surfaces of the substrate and the light-emitting layer when it is attached or detached thereto to thereby deteriorate interfacial properties. In addition, in the case of the polymer which forms the light-emitting layer, molecular weight is large so that adhesive strength of the film becomes higher after the LITI process is performed, which causes transfer properties to be deteriorated.

As a result, R, G, B patterning for the full color organic EL display device generally uses shadow mask technology to the latest, which is not suitable for patterning a large scaled display device.

In recent years, polymer types having a structure suitable for a photolithography process have been developed to pattern red, green, and blue light-emitting layers to fabricate the full color organic EL display device. However, in this method, a photo-acid generator which is blended to cure an exposed portion may cause impurities to infiltrate inside, and super acid resulted from curing may cause active materials to be damaged so that reliability or lifetime of the device may be adversely affected.

SUMMARY OF THE INVENTION

It is therefore an aspect of the present invention to provide an improved organic EL device.

It is further an aspect of the present invention to provide a full color organic EL display device in which polymeric light-emitting material is patterned to form a light-emitting layer.

It is also an aspect of the present invention to provide a method for manufacturing the organic EL device.

It is still an aspect of the present invention to provide a full color organic EL display device in which thermosetting light-emitting material is fabricated by LITI and a method for manufacturing the same.

It is yet an aspect of the present invention to provide a full color organic EL display device in which light-to-heat conversion layer for converting light energy of an irradiated laser to heat energy is introduced, and a method for manufacturing the same.

It is another aspect of the present invention to provide a full color organic EL display device capable of ensuring large scaled pixel regions and a method for manufacturing the same.

In an exemplary embodiment of the present invention, a full color organic EL display device includes a substrate, a first electrode layer patterned on the substrate, an organic layer formed on the first electrode, the organic layer including first, second, and third patterned pixel regions, the organic layer comprising thermosetting light-emitting material, and a second electrode layer formed on the organic layer.

In this case, the full color organic EL display device comprises at least one light-to-heat conversion layer.

In this case, the light-to-heat conversion layer may absorb radiant rays of a laser irradiated, convert the absorbed light energy to heat energy, and cure a light-emitting material for forming the light-emitting layer, and may be formed between the substrate and the first electrode layer, between the first electrode and the organic layer, or below the substrate.

The method for manufacturing an organic electroluminescence display device, the method comprising: preparing a substrate; patterning a first electrode layer on the substrate; forming an insulating layer for defining pixel regions comprising a first pixel region, a second pixel region, and a third pixel region on the first electrode layer; applying a first light-emitting material on the pixel regions; selectively irradiating a laser only on the first pixel region to cure the first light-emitting material, and removing the uncured portions to form a first light-emitting layer; applying a second thermosetting light-emitting material on the regions except the first pixel region; selectively irradiating a laser only on the second pixel region to cure the second light-emitting material, and removing the uncured portions to form a second light-emitting layer; applying a third thermosetting light-emitting material on the third pixel region; selectively irradiating a laser only on the third pixel region to cure the third light-emitting material, and removing the uncured portions to form a third light-emitting layer; and forming a second electrode layer on the first to third light-emitting layers.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
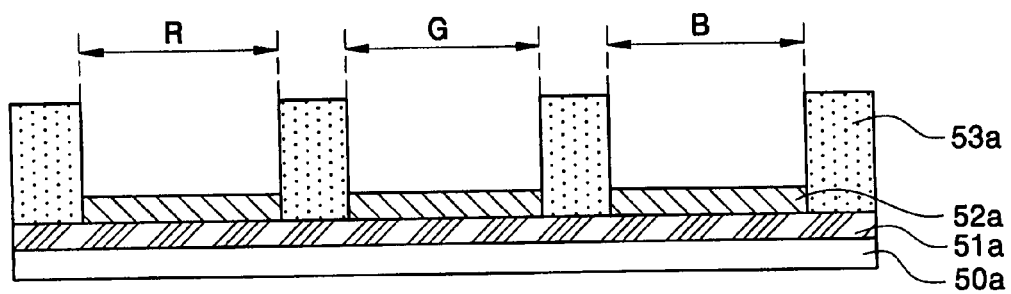
FIG. 1A through FIG. 1G show each step of manufacturing a full color organic EL display device in accordance with a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification. In the drawings, when one layer is located "on" the other layer or the substrate, it means that one layer can be directly formed on the other layer of the substrate or a third layer can be interposed therebetween.

Figure 1B:
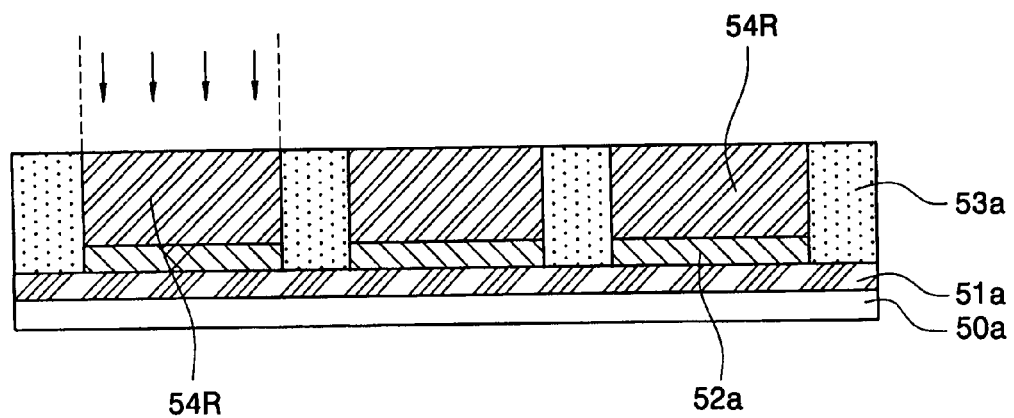
Figure 1C:
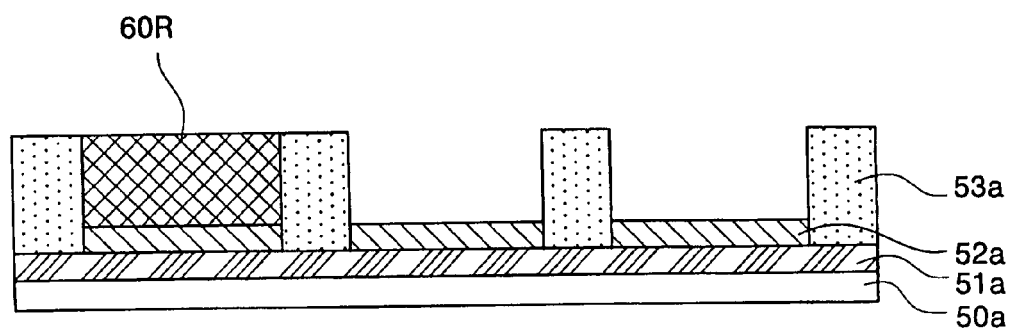
Figure 1D:
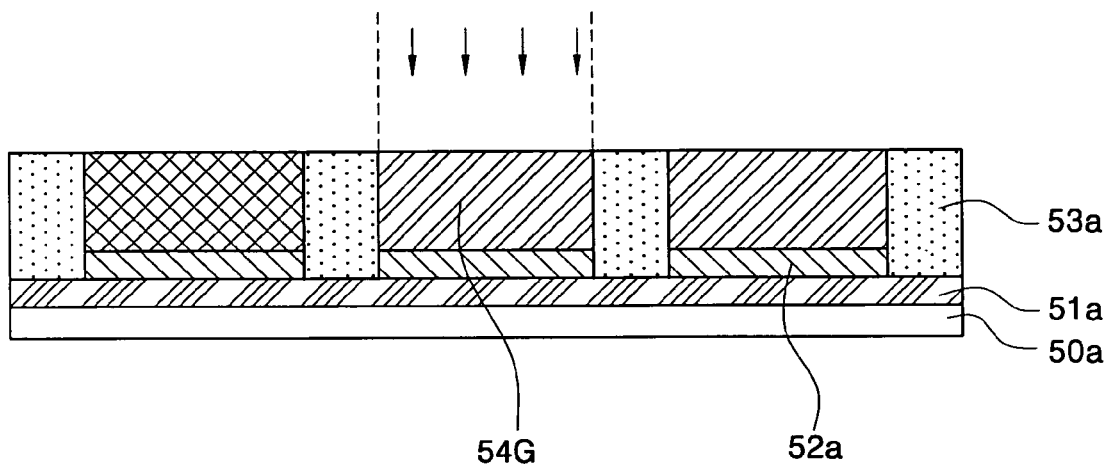
Figure 1E:
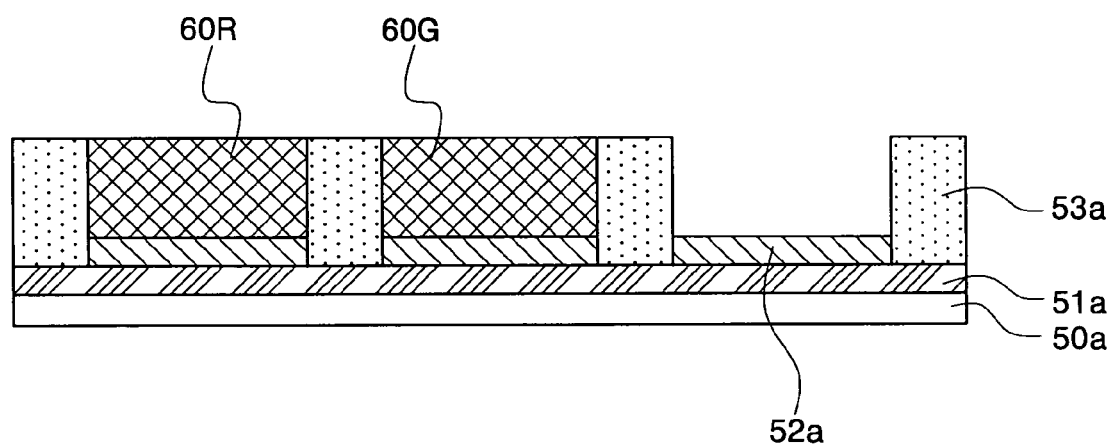
Figure 1F:
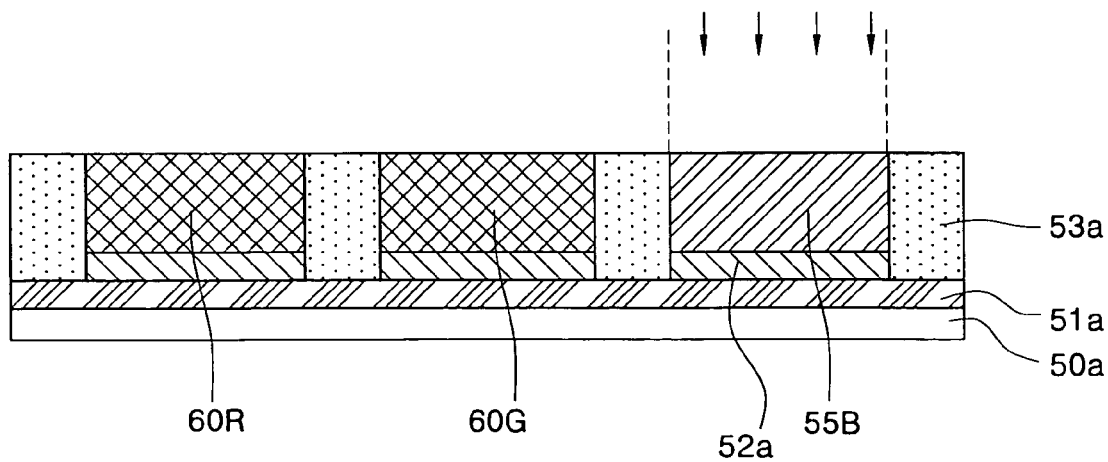
Figure 1G:
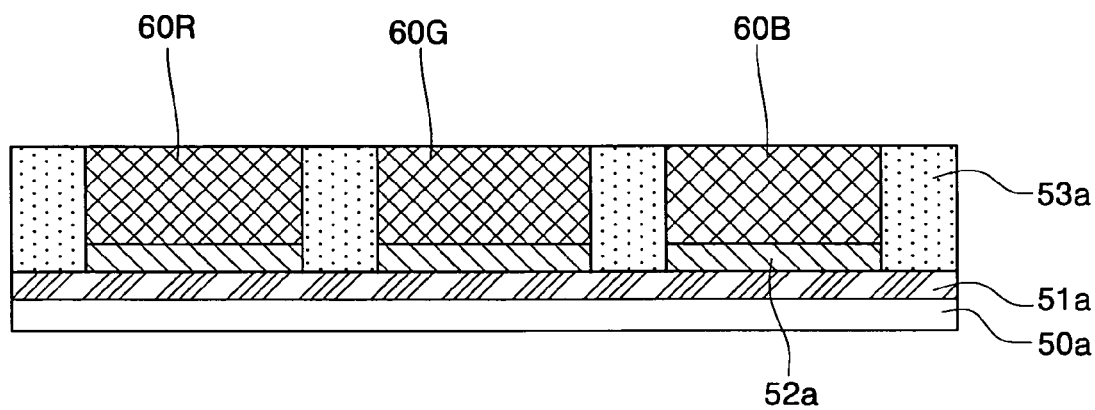
Figure 2:
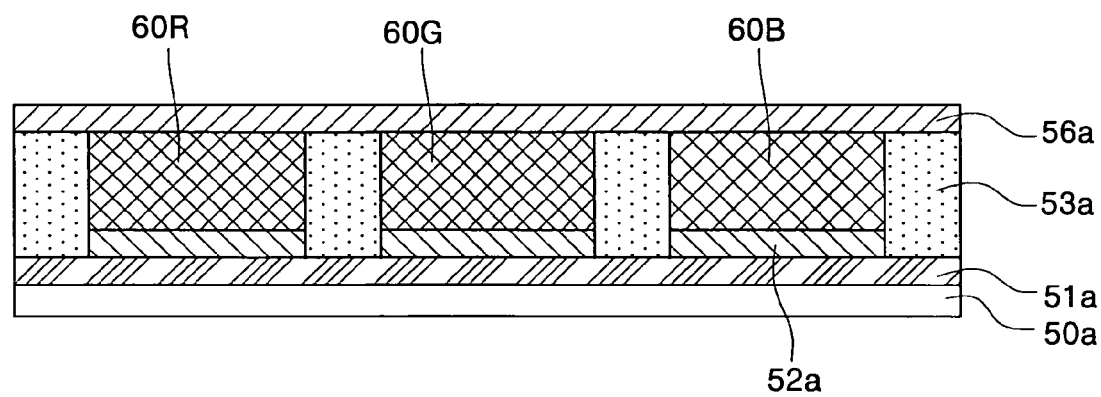
FIG. 2 is a cross-sectional view of a full color organic EL display device in accordance with a first embodiment of the present invention.

FIG. 1A to FIG. 1G show each step of manufacturing a full color organic EL display device in accordance with a first embodiment of the present invention, and FIG. 2 is a cross-sectional view of a full color organic EL display device in accordance with a first embodiment of the present invention.

To detail this, as shown in FIG. 2, the full color organic EL display device in accordance with the first embodiment of the present invention comprises a substrate 50a, a light-to-heat conversion layer 51a formed over the entire surface of the substrate 50a, a first electrode layer 52a formed and patterned on the light-to-heat conversion layer 51a, an organic layer including first, second, and third light-emitting layers 60R, 60G, and 60B patterned on the first electrode layer 52a, and a second electrode layer 56a formed on the organic layer over the entire surface of the substrate 50a. The full color organic EL display device having the above-mentioned structure is fabricated by the following steps of forming the light-to-heat conversion layer 51a on the substrate 50a, patterning the first electrode layer 52a on the light-to-heat conversion layer 51a, forming an insulating layer 53a for defining first, second, and third pixel regions on the first electrode layer 52a, applying a first thermosetting light-emitting material 54R on the pixel regions, selectively irradiating a laser only on the first pixel region R to cure the first light-emitting material 54R, and removing the uncured portions to form the first light-emitting layer 60R, applying a second thermosetting light-emitting material 54G on the regions except the first pixel region R, selectively irradiating the laser only on the second pixel region R to cure the second light-emitting material 54G, and removing the uncured portions to form the second light-emitting layer 60G; applying a third thermosetting light-emitting material 54B on the third pixel region B, selectively irradiating the laser only on the third pixel region B to cure the third light-emitting material 54B, and removing the uncured portions to form the third light-emitting layer 60B; and forming the second electrode layer 56a on the first, second, and third light-emitting layers 60R, 60G, and 60B over the entire surface of the substrate 51a.

In this case, the first to third light-emitting materials are thermosetting materials, which may be cured by receiving the heat energy converted from light energy of the laser through the light-to-heat conversion layer so as to allow patterning of the red, green, and blue light-emitting layers 60R, 60G, and 60B on the substrate.

In the present embodiment, for simplicity of description, red light-emitting material 54R is used as the first light-emitting material to form the red light-emitting layer 60R, green light-emitting material 54G is used as the second light-emitting material to form the green light-emitting layer 60G, and blue light-emitting material 54B is used as the third light-emitting material to form the blue light-emitting layer 60B, and this order may be properly changed.

Hereinafter, each step will be described in detail with reference to accompanying drawings. As shown in FIG. 1A, an insulating substrate 50a such as a glass substrate is cleaned, and the light-to-heat conversion layer 51a is formed on the insulating substrate 50a. The light-to-heat conversion layer 51a includes an active material for absorbing the laser light in its layer, and acts to convert some of the absorbed laser to heat energy to be delivered to the light-emitting materials 54R, 54G, and 54B.

The light-to-heat conversion layer 51a is formed in the form of a thin layer containing an active material for absorbing radiant rays. The light-to-heat conversion layer 51a may be a thin layer formed of the active material itself, or a thin layer in which the active material is dispersed by means of binding agents or the like.

In this case, the active material is preferably capable of absorbing the radiant rays of the laser and has an optical density of about 0.2 to 3 in the wavelength of radiant rays. By way of example, the active material may be a black azo pigment based on chromium or copper complex of nickel ditiolene, pyrazolone yellow, dianisidine red and nickel azo yellow; metal oxides such as carbon black, Cr/CrOx, black aluminum; and an inorganic pigment such as graphite.

The binding agent, for example, includes a film-forming polymer such as phenolic resin (e.g., novolac resin, resole resin), polyvinylbuthylal resin, polyvinylacetate resin, polyvinylacetal resin, polyvinylidene chloride resin, polyacrylates resin, polycarbonate resin, ether and ester resin based on cellulose, and nitrocellulose. A proper binding agent may include a monomer that is capable of being polymerized or crosslinked, an oligomer, or a polymer that is polymerized or crosslinked. The binding agent should not be melted at a temperature of 120° C. to 130° C., which is the thermosetting temperature of light-emitting material when the LITI process is performed.

In this case, the light-to-heat conversion layer 51a is formed in the form of a thin layer, and a metallic layer and a metal compound layer may be formed by sputtering and evaporative deposition, and granular coating may be formed using a binding agent and any proper dry or wet coating process.

In addition, the light-to-heat conversion layer 51a may be formed to be integrated with at least two light-to-heat conversion layers containing similar or different materials, and by way of example, it may be formed by depositing thin black aluminum on the coating layer containing carbon black dispersed in the binding agent.

Next, transparent electrode materials or metal electrode materials are deposited and patterned on the light-to-heat conversion layer 51a to form the first electrode layer 52a. In this case, a metal layer as a reflective layer, and a double stacked layer of a metal layer-transparent electrode are used as the first electrode layer 52a in the case of a top surface emitting structure, and ITO, IZO, polythiophene derivatives, polypyrrole derivatives, and polyaniline derivatives which are transparent electrodes are used as the first electrode layer in the case of a bottom surface emitting structure. The second electrode layer 56a is formed as the transparent electrode in the case of the top surface emitting structure and as a structure of transparent electrode material stacked on metal material or a metal plate which is a reflecting layer in the case of the bottom surface emitting structure. The second electrode layer 56a is an anode when the first electrode layer 52a is a cathode, and the second electrode layer 56a is the cathode when the first electrode layer 52a is the anode.

Next, an insulating layer 53a for defining first, second, and third pixel regions R, G, and B is formed on the first electrode layer 52a.

Referring to FIG. 1B, a thermosetting red light-emitting material 54R is then applied on the pixel regions. The thermosetting red light-emitting material 54R is capable of performing curing reaction by means of heat, and it may be a thermosetting light-emitting polymer containing a thermosetting functional group, a blend of a thermosetting non-light-emitting small molecule and a light-emitting polymer without a thermosetting functional group, and a blend of the thermosetting non-light-emitting small molecule or the thermosetting light-emitting polymer containing the thermosetting functional group.

The thermosetting light-emitting polymer is one or a blend containing at least two kinds comprised of a light-emitting polymer in which multiple bonds capable of causing thermosetting reaction within a molecular structure is included, and a light-emitting polymer containing a thermosetting functional group in a main-chain or a side-chain.

By way of example, the thermosetting polymer may be poly (phenylenvinylene) (PPV), poly(p-phenylene) (PPP), polyfluorene (PF), poly(dialkylfluorene), polythiophene (PT), poly(9-vinylcarbazole), poly(N-vinylcarbazole-vinylalcohol)copolymer, triarylamine containing a silane group, polynorbornene containing triarylamine, polyaniline, polyaryl(polyamine), triphenylamine-polyetherketone, or a blend thereof. The thermosetting light-emitting material may be formed of the above-mentioned material alone or it may be further doped with fluorescent or phosphorous doping materials.

The non-light-emitting small molecule may be a benzocyclobutene-based small molecule containing multiple bonds so that thermosetting reaction can be performed, or a blend of dicyclopentadienone derivatives-diacethylene derivatives containing SiLK™ fabricated by Dow Corning Co. The non-light-emitting small molecule is used by blending with a polymer selected from a group consisting of a light-emitting polymer not containing a thermosetting functional group and a thermosetting light-emitting polymer containing a thermosetting functional group. Derivatives of the light-emitting polymer containing the thermosetting functional group are used for the light-emitting polymer not containing the thermosetting functional group. By way of example, the light-emitting polymer without any thermosetting functional group includes an oligomer, a polymer, or a blend of at least two kinds of the oligomer and/or the polymer. The polymer, the oligomer and the blend have the basic structure of poly (phenylenvinylene) (PPV), poly (p-phenylene) (PPP), polyfluorene (PF), poly(dialkylfluorene), polythiophene (PT), poly(9-vinylcarbazole), poly(N-vinylcarbazole-vinylalcohol) copolymer, triarylamine containing silane group, polynorbornene containing triarylamine, polyaniline, polyaryl(polyamine), or triphenylamine-polyetherketone.

The thermosetting red light-emitting material used in the present step includes thermosetting materials doped with dicyanomethylene derivatives, rubrene, perylene diimide derivatives, platinum, or iridium complex, which are commonly used in the art.

The thermosetting red light-emitting material 54R is dissolved by a solvent so that it is formed by a wet coating method for applying it in a solution state, and spin coating, dip coating, spraying, screen printing, and inkjet printing may be used in addition to typical methods used in the art.

Next, referring to FIG. 1B and FIG. 1C, a laser is selectively irradiated on the applied red light-emitting material 54R to cure only the red light-emitting material which corresponds to the first pixel region R to thereby form the red light-emitting layer 60R, and uncured portions (not shown) in the regions except the red light-emitting layer 60R are removed.

In this case, the light energy of the irradiated laser is converted by the light-to-heat conversion layer 51a formed below the first electrode layer 52a to heat energy, and this heat energy is delivered back to the upper light-emitting materials 54R, 54G, and 54B, so that a thermosetting reaction such as the Diels-Aider reaction is progressed by the heat energy delivered to the red light-emitting material 54R. As a result, the cured red light-emitting material 54R is stably formed in the form of a thin layer on the first electrode layer 52a, and the cured red light-emitting material 54R can obtain superior resistant properties to a solvent which is used for removing the uncured red light-emitting material 54R during a subsequent process.

The thermal transfer using light generated from the laser in the present invention is exact and precise so that it has a significant advantage of forming fine patterns. In this case, the size and shape (e.g., line, circle, quadrangle, or other shapes) of the transferred pattern may be properly controlled by selecting an amount of light rays, exposing-pattern of light rays, contact time of light rays with a light-emitting layer or the like. In this case, the laser irradiation is preferably performed under vacuum or inactive atmosphere condition, and exposing duration of the laser may be several microseconds× 10−2 to 1oms or more, and it is properly adjusted in response to the used thermosetting light-emitting material and other factors.

In this case, the uncured red light-emitting material 54R is readily removed by a solvent. This solvent includes an organic solvent capable of selectively removing the uncured portion except the light-emitting layer formed by the curing reaction. The selection of such solvent may depend on the thermosetting light-emitting material to be used, to detail specific examples, see Merck Index, An Encyclopedia of Chemicals, Drugs, & Biologicals, or Polymer Handbook. By way of example, when the thermosetting light-emitting material includes Dow BCB which is a benzocyclobutene-based polymer, the uncured portion may be readily and selectively removed by an organic solvent of toluene, xylene, trimethylbenzene.

Hereinafter, the above-mentioned method is also performed to form red and blue light-emitting layers 60G and 60B.

Referring to FIG. 1D and FIG. 1E, in order to form the green light-emitting layer 60Q, thermosetting green light-emitting material 54G for forming the green light-emitting layer 60G is applied on the regions except the first pixel region R where the red light-emitting layer 60R is already formed. In this case, the green light-emitting material 54G to be used is one capable of being cured by heat, which includes thermosetting materials doped with quinacridone derivatives, aluminum complex, iridium complex or the like.

Referring to FIG. 1F and FIG. 1G, a laser is selectively irradiated on the green light-emitting material 54G to cure only the green light-emitting material 54G corresponding to the second pixel region G to thereby form the green light-emitting layer 60G, and uncured portions (not shown) in the regions except the region where the green light-emitting layer 60G is already formed are then removed. In this case, the green light-emitting material 54G may be applied on the red light-emitting layer 60R that is already formed, however, it is not cured because the laser is not irradiated, so that the green light-emitting material 54G applied on the red light-emitting layer 60R may be readily removed by a solvent.

Next, in order to form the blue light-emitting layer 60B, thermosetting blue light-emitting material 54B capable of emitting blue light is applied on the third pixel region B. In this case, the blue light-emitting material 54B to be used is one capable of being cured by heat, which includes thermosetting materials doped with distryl derivatives, iridium complex or the like.

A laser is selectively irradiated on the blue light-emitting material 54B to cure only the blue light-emitting material 54B corresponding to the third pixel region B to thereby form the blue light-emitting layer 60B, and uncured portions (not shown) in the regions except the region where the blue light-emitting layer 60B is already formed are then removed. In this case, the blue light-emitting material 54B may be applied on the red and green light-emitting layers that are already formed, however, they are not cured because the laser is not irradiated, so that the blue light-emitting material 54B applied on the red and green light-emitting layers 60R and 60G may be readily removed by a solvent.

Next, a second electrode layer 56 is formed on the red, green, and blue light-emitting layers 60R, 60G, and 60B, and a typical encapsulation process is then performed to thereby fabricate the full color organic EL display device in accordance with the first embodiment.

Figure 3:
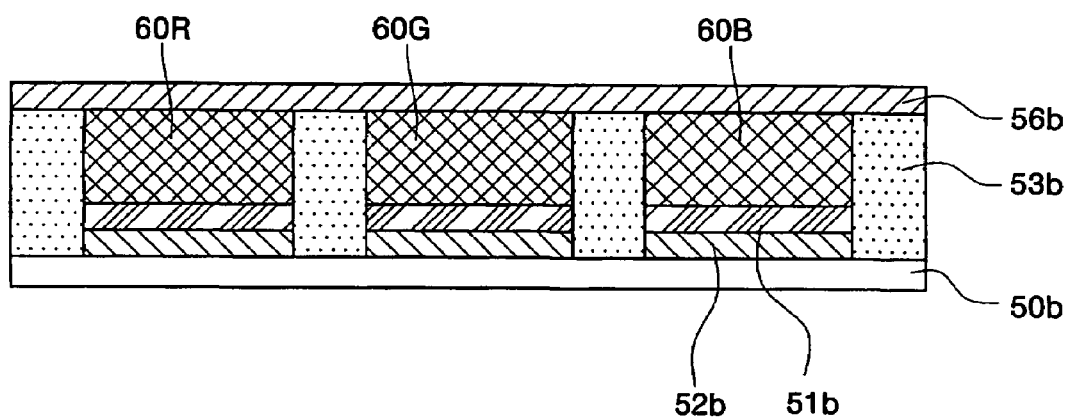
FIG. 3 is a cross-sectional view of a full color organic EL display device in accordance with a second embodiment of the present invention.

FIG. 3 is a cross-sectional view of a full color organic EL display device in accordance with a second embodiment of the present invention.

As shown in FIG. 3, the full color organic EL display device comprises a first electrode layer 52b, a light-to-heat conversion layer 51b, an organic layer including at least each one of red, green, and blue light-emitting layers 60R, 60G, and 60B, and a second electrode layer 56b, which are stacked in this order on a substrate 50b.

The method for manufacturing the full color organic EL display device having the above-mentioned structure and materials are the same as the first embodiment, and the second embodiment differs from the first embodiment in that the light-to-heat conversion layer 51b and the first electrode layer 52b are differently formed.

Figure 4:
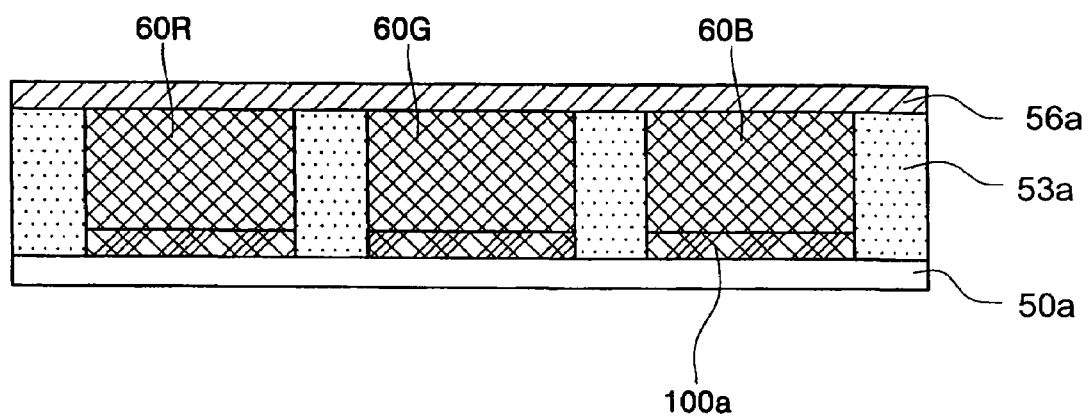
FIG. 4 is a cross-sectional view of a full color organic EL display device in accordance with a third embodiment of the present invention.

FIG. 4 is a cross-sectional view of a full color organic EL display device in accordance with a third embodiment of the present invention.

As shown in FIG. 4, the full color organic EL display device comprises a light-to-heat conversion layer (100a) functioning as an electrode, an organic layer including at least each one of first, second, and third light-emitting layers 60R, 60G, and 60B, and a second electrode layer 56a, which are stacked in this order on the substrate 50a.

The full color organic EL display device having the above-mentioned structure is fabricated by the following steps of: patterning a light-to-heat conversion layer 100a capable of acting as an electrode on the substrate 50a; forming an insulating layer 53a for defining first, second, and third pixel regions on the light-to-heat conversion layer 100a capable of acting as the electrode; applying the first thermosetting light-emitting material 54R on the pixel regions, selectively irradiating a laser only on the first pixel region R to cure the first light-emitting material 54R, and removing the uncured portions; applying the second thermosetting light-emitting material 54G on the pixel regions except the second pixel region G, selectively irradiating the laser only on the second pixel region G to cure the second light-emitting material 54G, and removing the uncured portions to form the second light-emitting layer 60G; applying the third thermosetting light-emitting material 54B on the third pixel region B, selectively irradiating the laser only on the third pixel region B to cure the third light-emitting material 54B, and removing the uncured portions to form the third light-emitting layer 60B; and forming the second electrode layer 56a on the first to third light-emitting layers 60R, 60B, and 60B over the entire surface of the substrate 50a.

In the full color organic EL display device fabricated in accordance with the third embodiment of the present invention, the light-to-heat conversion layer 100 functions as the first electrode layer 52a of the first embodiment, and it may be metal oxides such as Cr/CrOx, black aluminum and the like, and carbon.

As mentioned above, in accordance with the light-to-heat conversion layers 51a, 51b, and 100 of the present invention, the light-to-heat conversion layer 51a is introduced between the substrate 50a and the first electrode layer 52a in the first embodiment, and it is introduced between the first electrode layer 52b and the light-emitting layers 60R, 60G, and 60B in the second embodiment, and it acts as an electrode to be introduced between the substrate 50b and the light-emitting layers 60R, 60G, and 60B in the third embodiment. In this case, a thermosetting polymer material is used for forming the light-emitting layers 60R, 60G, and 60B, so that the polymeric light-emitting layer may be readily patterned in the full color organic EL display device.

Moreover, the light-to-heat conversion layers 51a, 51b, and 100 may be applied between the substrates 50a and 50b and a passivation layer of a thin film transistor in the full color organic EL display device including the thin film transistor.

The organic layers of the full color organic EL display device of the present invention may further include a hole injecting layer (HIL), a hole-transport layer (HTL), a hole blocking layer (HBL), an electron transporting layer (ETL), and/or an electron injecting layer (EIL) between the first electrode layers 52a and 52b and the second electrode layers 56a and 56b.

As mentioned above, when the full color organic EL display device is fabricated in accordance with the present invention, thermosetting polymeric light-emitting materials are used, and a light-to-heat conversion layer is introduced to cure the material, so that the light-emitting layer may be readily patterned. As a result, problems caused by the LITI or photolithography process may be overcome.

More particularly, the present invention uses thermosetting polymeric light-emitting materials, so that the polymeric light-emitting layer may be formed by irradiating an external laser, in particular, only locally selected pixel region may be irradiated by the laser, which enables red, green, and blue light-emitting layers using the polymeric light-emitting materials to be patterned. As a result, the polymeric light-emitting layers have superior interfacial properties, and since impurities are not infiltrated inside when the light-emitting layers are formed, element properties become stable and lifetime of the full color organic EL display device increases.

Furthermore, in accordance with the fabrication method of the present invention, a donor film, which has been used in the conventional LITI method, is not used, so that it may also be applied to the substrate of a complicated structure having stepped regions. As a result, interfacial damage caused by attachment or detachment of the conventional donor film may be suppressed, and the light energy of the laser is converted to the heat energy for curing the light-emitting material, so that problems such as light-emitting material damage and impurity infiltration in the conventional photolithography process may be overcome.

The full color organic EL display device in accordance with the present invention has a top surface emitting structure or a bottom surface emitting structure based on components of the first and second electrode layers.

In addition, the full color organic EL display device may be applied to an active matrix full color organic electroluminescence display including thin film transistors or a passive matrix full color organic electroluminescence not including the thin film transistors.

As mentioned above, in accordance with the method for manufacturing the full color organic EL display device of the present invention, light-emitting layers are formed on the light-to-heat conversion layer arranged above or below the substrate, and light energy of the laser irradiated through the light-to-heat conversion layer is converted to heat energy to cure the applied polymeric light-emitting materials, which leads to easy formation of the light-emitting layers.

Such a fabrication method may be properly applied to a substrate of a complicated structure with a height step, and patterning may be performed on the conventional polymeric light-emitting layers without using any masks. In particular, red, green, and blue light-emitting layer patterns may be readily formed when the full color EL display device is fabricated.

The full color organic EL display device fabricated by the above-mentioned method may have increased reliability and lifetime, and readily obtain a fine pattern of the light-emitting layer, and may be properly applied to a large scaled device.

While the present invention has been described with reference to a particular embodiment, it is understood that the disclosure has been made for the purpose of illustrating the invention by way of examples and is not limited to limit the scope of the invention. And one skilled in the art can make amend and change the present invention without departing from the scope and spirit of the invention.

What is claimed is:

1. An organic electroluminescence display device, comprising:
   a substrate;
   a first electrode layer patterned on the substrate;
   an organic layer formed on the first electrode, said organic layer including first, second, and third patterned pixel regions, said organic layer comprising thermosetting light-emitting material;
   at least one light-to-heat conversion layer formed between the substrate and the organic layer; and
   a second electrode layer formed on the organic layer.

2. The organic electroluminescence display device as claimed in claim 1, wherein the thermosetting light-emitting material is selected from a group consisting of a thermosetting light-emitting polymer containing a thermosetting functional group, a blend of a thermosetting non-light-emitting small molecule and a light-emitting polymer without a thermosetting functional group, and a blend of the thermosetting non-light-emitting small molecule and the thermosetting light-emitting polymer containing the thermosetting functional group.

3. The organic electroluminescence display device as claimed in claim 2, wherein the thermosetting light-emitting polymer has a basic structure selected from a group consisting of poly (phenylenvinylene) (PPV), poly(p-phenylene) (PPP), polyfluorene (PF), poly(dialkylfluorene), polythiophene (PT), poly(9-vinylcarbazole), poly(N-vinylcarbazole-vinylalcohol)copolymer, triarylamine containing silane group, polynorbornene containing triarylamine, polyaniline, polyaryl(polyamine), and triphenylamine-polyetherketone.

4. The organic electroluminescence display device as claimed in claim 2, wherein the thermosetting non-light-emitting small molecule is one of a benzocyclobutene-based small molecule, and a blend of dicyclopentadienone derivatives-diacethylene derivatives.

5. The organic electroluminescence display device as claimed in claim 2, wherein the light-emitting polymer without the thermosetting functional group is an oligomer, a polymer, or a blend thereof, where the oligomer, the polymer and the blend have a basic structure selected from a group consisting of poly(phenylenvinylene) (PPV), poly(p-phenylene) (PPP), polyfluorene (PF), poly(dialkylfluorene), polythiophene (PT), poly(9-vinylcarbazole), poly(N-vinylcarbazole-vinylalcohol)copolymer, triarylamine containing a silane group, polynorbornene containing triarylamine, polyaniline, polyaryl(polyamine), and triphenylamine-polyetherketone.

6. The organic electroluminescence display device as claimed in claim 1, wherein the light-to-heat conversion layer is formed between the substrate and the first electrode layer.

7. The organic electroluminescence display device as claimed in claim 1, wherein the light-to-heat conversion layer is the same as the first electrode layer.

8. The organic electroluminescence display device as claimed in claim 1, wherein the light-to-heat conversion layer is formed of an active material alone or a binding agent and the active material, and the active material is capable of absorbing light energy to convert the absorbed light energy to heat energy.

9. The organic electroluminescence display device as claimed in claim 8, wherein the active material contains at least one selected from a group consisting of black azo pigment based on chromium or copper complex of nickel ditiolene, pyrazolone yellow, dianisidine red and nickel azo yellow, metal oxides, carbon black, Cr/CrOx, black aluminum, inorganic pigment, and graphite.

10. The organic electroluminescence display device as claimed in claim 8, wherein the binding agent is selected from a group consisting of phenolic resin, polyvinylbuthylal resin, polyvinylacetate resin, polyvinylacetal resin, polyvinylidene chloride resin, polyacrylates resin, polycarbonate resin, ether and ester resin based on cellulose, and nitrocellulose.

11. The organic electroluminescence display device as claimed in claim 1, wherein the light-to-heat conversion layer is formed between the first electrode layer and the organic layer.

12. The organic electroluminescence display device as claimed in claim 1, wherein the light-to-heat conversion layer and the first electrode are formed in a single layer functioning as both the first electrode and the light-to-heat conversion layer.

* * * * *